AUTOMATIC GAIN CONTROL FOR TRANSISTOR RECEIVER CIRCUITS
Filed Feb. 13, 1957
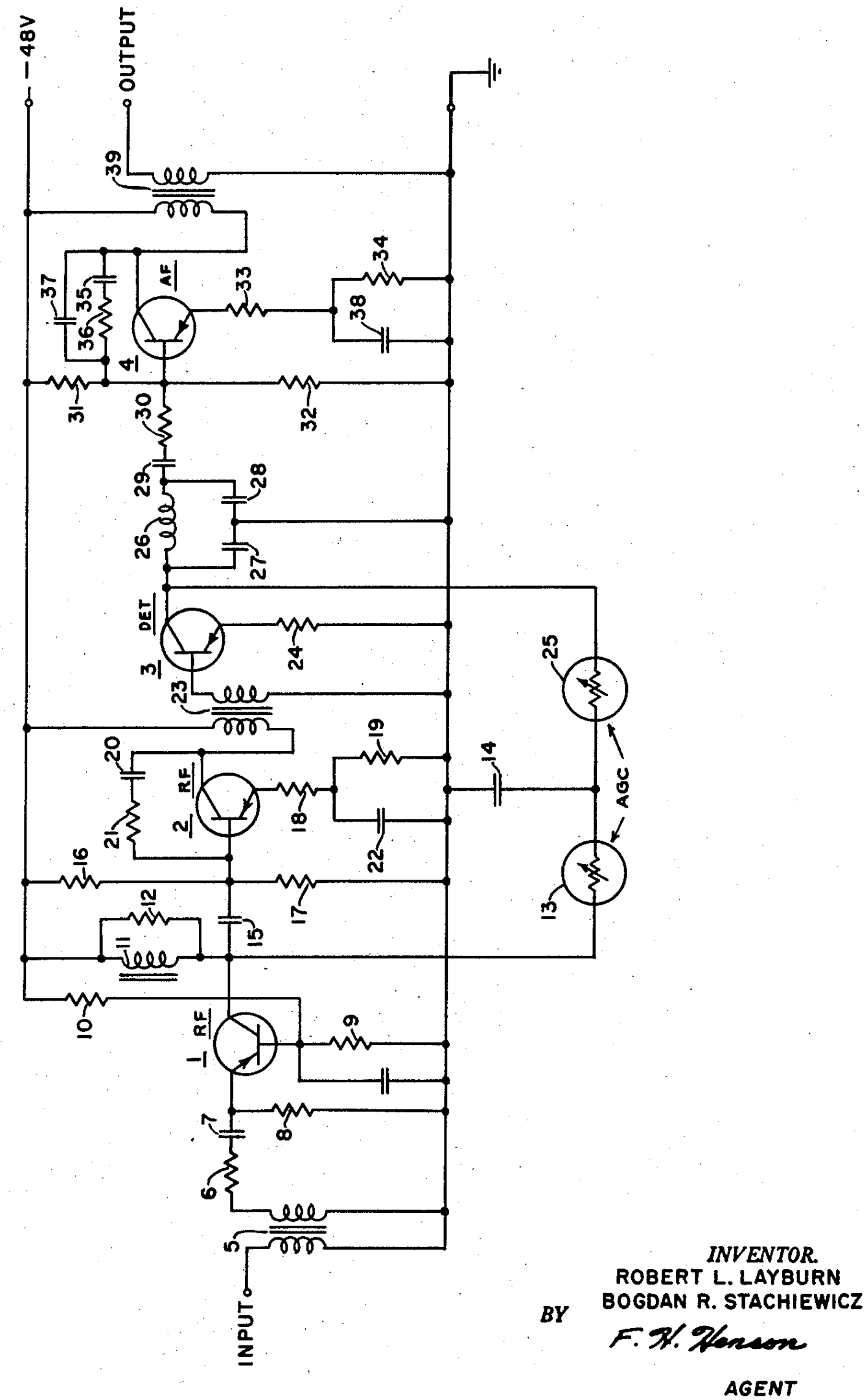
INVENTOR.
ROBERT L. LAYBURN
BOGDAN R. STACHIEWICZ
BY
F. W. Henson
AGENT 2,892,932

AUTOMATIC GAIN CONTROL FOR TRANSISTOR RECEIVER CIRCUITS

Robert L. Layburn and Bogdan R. Stachiewicz, Rochester, N.Y., assignors to General Dynamics Corporation, Rochester, N.Y., a corporation of Delaware Application February 13, 1957, Serial No. 639,910

6 Claims. (Cl. 250—20)

This invention relates in general to amplitude modulated radio and carrier system receivers and, more particularly, to automatic gain control circuits for use in transistor receiver circuits.

Although the circuit herein disclosed may be used in any system in which double sideband transmission is employed, it is particularly adapted for use in telephone carrier systems. As is well known in the telephone art, telephone carrier systems are required to function over very wide ranges of ambient temperature and line attenuation. Furthermore, in subscriber carrier systems, the equipment must have low power and maintenance requirements since the subscriber terminal equipment is pole mounted. It is, therefore, particularly desirable that transistors be used as the principal elements in subscriber carrier systems.

Automatic gain control in vacuum tube signal receivers is conventionally backward acting. That is, the signal appearing at the output of one stage of the receiver is rectified, amplified in a D.-C. amplifier, and the resulting amplified D.-C. voltage is applied to the grid of a tube in a preceding stage to control the gain of that stage. Considerable D.-C. amplification is required in the control loop of a carrier receiver since it may be necessary to regulate signal variations of $\pm 10$ db or more from nominal input to $\pm 1$ db or less at the output. In other words, a change of 1 db in the output signal must result in a 10 db change in the gain of the input stage.

It has been determined that the conventional backward acting gain control circuit used in receivers employing vacuum tubes is not practical for use in a transistor receiver since a transistor is essentially a current operated, power consuming device rather than a voltage sensitive device. Theoretically, the rectified signal current appearing at the output of the detector transistor in a transistor receiver could be amplified in a D.-C. amplifier and the resulting amplified D.-C. current could be injected in the base of the input amplifier transistor. However, the injection of control current in the base of a transistor results in a degree of frequency distortion which is not acceptable in carrier receivers. Furthermore, it is desirable to avoid the use of transistor D.-C. amplifiers whenever possible in equipment which is subject to wide variations in ambient temperature since transistor D.-C. amplifiers are difficult to stabilize against variations of operating point resulting from variations of collector cutoff current with temperature. And, finally, the order of amplification required in the D.-C. control loop cannot be achieved with a single temperature stabilized germanium transistor. It is, therefore, necessary to use more than one germanium transistor or a relatively expensive but more stable silicon transistor in the D.-C. amplifier circuit.

Accordingly, it is the general object of this invention to provide a new and improved transistor receiver.

It is a more particular object of this invention to provide a new and improved gain control circuit for transistor receivers.

In accordance with this invention, an essentially forward acting gain control circuit, which does not require a D.-C. amplification stage, is provided in a transistor receiver. Variations in the rectified signal current produced at the output of the receiver detector are used to automatically vary the load impedance of both the detector transistor and a high frequency amplifier transistor preceding the detector and, thus, regulate the output signals from those stages.

The transistor receiver herein disclosed comprises two high frequency amplifiers, a detector, and an audio amplifier connected in cascade. Two negative temperature coefficient of resistance devices, or thermistors, are connected in series between the output electrode of the first high frequency amplifier transistor and the output electrode of the detector transistor. The output electrode of the high frequency amplifier transistor is returned to a source of potential through a choke coil and the junction point of the two series-connected thermistors is returned to ground through a capacitor. Thus, the first thermistor serves as an A.-C. load impedance for the first high frequency amplifier, and operating potential is supplied to the detector transistor through the series-connected thermistors. Since the impedance of the thermistors varies inversely with variations in the rectified carrier signal current appearing in the output of the detector transistor, the output signals from both the first high frequency amplifier and the detector are automatically regulated by the thermistors and the regulation has no effect on the operating characteristics of the transistors. The output signal from the first amplifier is regulated by only the amount necessary to prevent overdriving the succeeding stages under the condition of maximum signal input and the remaining regulation is performed on the output signal from the detector. Since thermistors are used as the regulating elements, the response of the automatic gain control circuit is rather slow and, as a result, the gain control circuit is not responsive to rapid variations in the audio signal appearing at the output of the detector.

Further objects and advantages of the invention will become apparent as the following description proceeds, and features of novelty which characterize the invention will be pointed out in particularity in the claims annexed to and forming a part of this specification.

For a better understanding of the invention, reference may be had to the accompanying drawing which shows a transistor receiver.

The illustrated receiver includes two high frequency amplifier stages, a detector stage, and an audio amplifier stage, which comprise transistors 1, 2, 3 and 4, respectively, as principal elements thereof. The receiver has been illustrated as comprising p-n-p junction transistors. As is well known in the art, n-p-n junction transistors could be used in the illustrated receiver by merely reversing the polarity of the biasing potentials. Input signals, which may be coupled through a bandpass filter and an attenuating network and which comprise a carrier signal modulated with intelligence or audio signals, are applied to the primary winding of transformer 5 and the signals induced in the secondary winding of transformer 5 are coupled through resistor 6 and capacitor 7 to the emitter electrode of the common base amplifier transistor 1. Bias is obtained for transistor 1 by returning the emitter electrode through resistor 8 to ground potential and by returning the base electrode through resistors 9 and 10 to ground and minus forty-eight volt potential, respectively. The output electrode or collector of transistor 1 is supplied operating potential from minus forty-eight volts through the parallel connected inductor 11 and resistor 12. The collector of transistor 1 is also returned to ground potential through thermistor 13 and capacitor 14. As will be explained more fully hereinafter, thermistor 13 serves as the A.-C. load impedance for the first high frequency amplifier and the impedance value of thermistor 13 is varied in accordance with regulation requirements.

A common base configuration of the first amplifier stage is dictated by several considerations. Feedback cannot be used in this stage because of the variable gain requirements and consequently no easy method of improving the frequency response and of controlling distortion and intermodulation effects is readily available. As is well known in the art, the frequency cut-off of the grounded base transistor is extended by a factor of $$\frac{1}{1-\alpha}$$

over the grounded emitter configuration. Better linearity of characteristics can also be obtained with the base grounded, resulting in a decrease in intermodulation and distortion products. This is particularly important in carrier applications since the receiver for each channel must be identical to the receivers for all of the other channels and, therefore, a very wide frequency range must be covered without distortion. The very high output impedance feature of the grounded base configuration is utilized by connecting thermistor 13 as the output impedance of the stage so that the gain obtained is directly proportional to the value of the load impedance. By proper selection of the inductance of inductor 11 and the resistance of resistor 12, the output signal from transistor 1 is regulated a sufficient amount to prevent overdriving the succeeding stages on maximum signal input.

The output signal from transistor 1, appearing across thermistor 13 and capacitor 14, is coupled through capacitor 15 to the base of the common emitter amplifier transistor 2. Bias is obtained for the second high frequency amplifier stage by returning the base of transistor 2 through resistors 16 and 17 to minus forty-eight volt potential and ground, respectively, and by returning the emitter of transistor 2 through resistors 18 and 19 to ground potential. Both shunt and series feedback are used to stabilize the input and output impedances of the amplifier. Shunt feedback is provided by the connection of capacitor 20 and resistor 21 in series between the collector and base electrodes of transistor 2 and series feedback is obtained by the use of unbypassed resistor 18 in the emitter circuit. Resistor 19 is bypassed for signal frequencies by capacitor 22. The feedback provided is sufficient to stabilize the gain of the stage against manufacturing variations in transistors and against varying temperature and voltages. In a tested embodiment of the invention, the frequency response of this amplifier was held flat within $\pm .5$ db over a frequency range of 10–130 kc.

The output signal from transistor 2 is inductively coupled through transformer 23 to the base electrode of detector transistor 3. Since the base of transistor 3 is returned to ground potential through the secondary winding of transformer 23 and the emitter is returned to ground potential through resistor 24, transistor 3 is rendered conductive only on negative half cycles of the signal coupled to its base. As previously described, D.-C. operating potential is supplied to the collector electrode of transistor 3 from minus forty-eight volts through parallel connected inductor 11 and resistor 12, and through thermistors 13 and 25 in series. Thus, the D.-C. current flow due to the rectified carrier signal is used as the control current in the regulating loop and thermistor 25, the resistance of which varies inversely with this current, is used as the load impedance for the detector stage. Since a transistor is essentially a constant current device irrespective of the value of the load impedance, the intelligence or audio signal appearing across thermistor 25 is proportional to the impedance of thermistor 25.

A particular advantage of this type of detector is that it has decreased detection efficiency at very low input levels. Thus, crosstalk signals induced from adjacent carrier channels, which signals are usually at a level of 35 db or more below the desired signal, are not transmitted through the detector stage because the low level is insufficient to turn on the reversely biased base-emitter junction.

The collector of transistor 3 is coupled to the base of the common emitter audio amplifier transistor 4 through the low-pass filter, comprising inductor 26 and capacitors 27 and 28, through capacitor 29, and through resistor 30. The higher frequencies present in the output signal from transistor 3 are, of course, eliminated in the low-pass filter. Bias is obtained for transistor 4 by returning the base electrode through resistors 31 and 32 to minus forty-eight volt potential and ground potential, respectively, and by returning the emitter electrode through resistors 33 and 34 to ground potential. Shunt and series feedback are also used in this stage. Shunt feedback is obtained by the connection of capacitor 35 and resistor 36 in series between the collector and base electrodes, and by the connection of capacitor 37 between the collector and base electrodes. Series feedback is obtained from unbypassed emitter resistor 33. Resistor 34 is bypassed for signal frequencies by capacitor 38. The output signal from transistor 4 is coupled through transformer 39 to the output terminal, which may be connected, for example, to a hybrid coil having one winding connected to a subscriber line and telephone instrument.

It may be desirable under certain operating conditions, or when lower quality thermistors are used in the control loop, to provide indirect heating for the thermistors at extremely low values of ambient temperature. This can be accomplished by the use of a thermostat switch which is designed to interrupt the indirect heating circuit whenever the ambient temperature exceeds a predetermined value. Also, if it is desired to extend the range of the thermistors, or, if a different degree of regulation is desired, fixed resistors may be added in series or parallel with the thermistors.

While there has been shown and described what is at present considered to be the preferred embodiment of the invention, modifications thereto will readily occur to those skilled in the art. It is not desired, therefore, that the invention be limited to the embodiment shown and described, and it is intended to cover in the appended claims all such modifications as fall within the true spirit and scope of the invention.

What is claimed is:

1. Signal receiving apparatus comprising first and second high frequency amplifiers, a detector, and a low frequency amplifier, each of said amplifiers and said detector including a transistor having at least an input, an output, and a common electrode, means for applying a received signal comprising a carrier signal modulated with low frequency signals to the input electrode of said first high frequency amplifier transistor, means for coupling the signal appearing at the output electrode of each transistor to the input electrode of the succeeding transistor, and means for varying the load impedance of said first high frequency amplifier transistor and the load impedance of said detector transistor inversely with variations in the average value of rectified signals appearing in the circuit of the output electrode of said detector transistor.

2. Signal receiving apparatus comprising first and second high frequency amplifiers, a detector, and a low frequency amplifier connected in cascade, each of said amplifiers and said detector including a transistor having at least an input, an output, and a common electrode, automatic gain control means for varying the signal gain through said receiver in accordance with variations in amplitude of an applied signal, said last mentioned means comprising first and second impedance devices having a negative temperature coefficient of resistance connected in series between the output electrode of said first high frequency amplifier and the output electrode of said detector, means for returning the output electrode of said first high frequency amplifier to a source of potential through a first impedance element which presents a relatively low impedance to signals of zero frequency and a relatively high impedance to signals above zero frequency, and means for returning the junction point of said series connected devices to a point of common potential through a second impedance element which presents an infinite impedance to signals of zero frequency and a finite impedance to signals above zero frequency, whereby said first and second devices serve as alternating current load impedances for said first amplifier transistor and said detector transistor, respectively, and the impedances of said devices vary as inverse functions of the output electrode current of said detector transistor.

3. The apparatus of claim 2 in which said first impedance element is an inductor and said second impedance element is a capacitor.

4. Signal receiving apparatus comprising a high frequency amplifier, a detector, and a low frequency amplifier, each of said amplifiers and said detector including a transistor having at least an input, an output, and a common electrode, means for applying a received signal comprising a carrier signal modulated with low frequency signals to the input electrode of said high frequency amplifier transistor, means for coupling the output electrode of said high frequency amplifier transistor to the input electrode of said detector transistor, means for coupling the output electrode of said detector transistor to the input electrode of said low frequency amplifier transistor, and means responsive to variations in the average value of rectified signals appearing in the circuit of the output electrode of said detector transistor for regulating the magnitude of the signals coupled to the input electrodes of said detector transistor and said low frequency amplifier transistor, said last named means comprising first and second negative temperature coefficient impedance devices connected in series between the output electrode of said high frequency amplifier transistor and the output electrode of said detector transistor.

5. Signal receiving apparatus comprising first and second high frequency amplifiers, a detector, and a low frequency amplifier, each of said amplifiers including a transistor having at least an input, an output, and a common electrode, said detector comprising an input and an output, means for applying a received signal comprising a carrier signal modulated with low frequency signals to the input electrode of said first high frequency amplifier transistor, means for coupling the output electrode of said first high frequency amplifieer transistor to the input electrode of said second high frequency amplifier transistor, means for connecting the output electrode of said second high frequency amplifier transistor to the input of said detector, means for coupling the output of said detector to the input electrode of said low frequency amplifier transistor, and means for varying the load impedance of said first high frequency amplifier transistor and the load impedance of said detector inversely with variations in the average value of rectified signals appearing at the output of said detector.

6. Signal receiving apparatus comprising first and second high frequency amplifiers, a detector, and a low frequency amplifier connected in cascade, each of said amplifiers including a transistor having at least an input, an output, and a common electrode, said detector comprising an input and an output, automatic gain control means for varying the signal gain through said receiver in accordance with variations in amplitude of an applied signal, said last mentioned means comprising first and second impedance devices having a negative temperature coefficient of resistance connected in series between the output electrode of said first high frequency amplifier and the output of said detector, means for returning the output electrode of said first high frequency amplifier to a source of potential through a first impedance element which presents a relatively low impedance to signals of zero frequency and a relatively high impedance to signals above zero frequency, and means for returning the junction point of said series connected devices to a point of common potential through a second impedance element which presents an infinite impedance to signals of zero frequency and a finite impedance to signals above zero frequency, whereby said first and second devices serve as alternating current load impedances for said first amplifier transistor and said detector, respectively, and the impedances of said devices vary as inverse functions of the output current of said detector.

References Cited in the file of this patent

UNITED STATES PATENTS

| | | |
|---|---|---|
| 2,774,866 | Burger | Dec. 18, 1956 |
| 2,807,718 | Chressanthis et al. | Sept. 24, 1957 |
| 2,833,870 | Wilhelmsen | May 6, 1958 |

OTHER REFERENCES

Principles of Transistor Circuits, by Shea, © 1953, Lib. of Congress Card No. 53-10944, pp. 178-180.

Radio and Television News, May 1956, pages 68, 69, 131 and 134.